(12) United States Patent
Fehkuhrer

(10) Patent No.: US 9,922,862 B2
(45) Date of Patent: Mar. 20, 2018

(54) DEVICE AND METHOD FOR LOOSENING A FIRST SUBSTRATE

(71) Applicant: EV GROUP E. THALLNER GMBH, St. Florian am Inn (AT)

(72) Inventor: Andreas Fehkuhrer, Senftenbach (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 0 days.

(21) Appl. No.: 15/108,027

(22) PCT Filed: Jan. 28, 2014

(86) PCT No.: PCT/EP2014/051611

§ 371 (c)(1),
(2) Date: Jun. 24, 2016

(87) PCT Pub. No.: WO2015/113591

PCT Pub. Date: Aug. 6, 2015

(65) Prior Publication Data

US 2016/0329235 A1    Nov. 10, 2016

(51) Int. Cl.
*H01L 21/687*  (2006.01)
*B32B 43/00*  (2006.01)
*H01L 21/67*  (2006.01)

(52) U.S. Cl.
CPC .. *H01L 21/68728* (2013.01); *H01L 21/67092* (2013.01); *H01L 2221/68386* (2013.01);
(Continued)

(58) Field of Classification Search
CPC ....... H01L 2224/98; H01L 2221/68381; H01L 2221/68386; Y10S 156/93; Y10S 156/941;
(Continued)

(56) References Cited

U.S. PATENT DOCUMENTS 3,834,026 A * 9/1974 Klein ................ A61C 3/16
433/159
8,845,859 B2 * 9/2014 Ries ................ H01L 21/67092
156/714

(Continued)

FOREIGN PATENT DOCUMENTS

JP       2009200304 A      9/2009
WO   WO 2012139627 A1 * 10/2012   ....... H01L 21/67092
WO   WO 2013/091714 A1   6/2013   ............. H01L 21/67

OTHER PUBLICATIONS

International Search Report from corresponding International Patent Application No. PCT/EP2014/051611, dated Feb. 28, 2014.

*Primary Examiner* — Mark A Osele

(74) *Attorney, Agent, or Firm* — Kusner & Jaffe

(57) ABSTRACT

A device for detaching a first substrate from a second substrate in a detaching direction (L) with: at least two elements guided crosswise to the detaching direction (L) and in a radial direction (R) to the first substrate for clamping the first substrate crosswise to the detaching direction (L), a substrate holding device for holding the second substrate, and detaching means for detaching the first substrate from the second substrate by moving the first substrate, attached by the clamping elements, in the detaching direction (L) and/or by moving the substrate holding device opposite to the detaching direction (L). In addition, this invention relates to a corresponding method.

20 Claims, 5 Drawing Sheets

(52) U.S. Cl.
CPC .......... *Y10S 156/93* (2013.01); *Y10S 156/941* (2013.01); *Y10T 156/1132* (2015.01); *Y10T 156/1168* (2015.01); *Y10T 156/1944* (2015.01); *Y10T 156/1978* (2015.01)

(58) Field of Classification Search
CPC ......... Y10T 156/1168; Y10T 156/1132; Y10T 156/1978; Y10T 156/1944; Y10T 156/1989
See application file for complete search history.

(56) References Cited

U.S. PATENT DOCUMENTS

| | | | | |
|---|---|---|---|---|
| 8,852,391 | B2* | 10/2014 | McCutcheon | H01L 21/187 156/714 |
| 9,159,596 | B2* | 10/2015 | Young | H01L 21/67092 |
| 9,296,193 | B2* | 3/2016 | Burggraf | H01L 21/67092 |
| 2007/0145231 | A1 | 6/2007 | Chen et al. | 248/689 |
| 2009/0062869 | A1* | 3/2009 | Claverie | A61B 90/50 606/324 |
| 2009/0166930 | A1 | 7/2009 | Fujita et al. | 264/334 |
| 2009/0314430 | A1 | 12/2009 | Nakamura | 156/344 |
| 2011/0266709 | A1 | 11/2011 | Song et al. | 264/101 |
| 2012/0247685 | A1 | 10/2012 | Burrows et al. | 156/703 |

* cited by examiner

DEVICE AND METHOD FOR LOOSENING A FIRST SUBSTRATE

FIELD OF THE INVENTION

The invention relates to a device for detaching a first substrate from a second substrate in a detaching direction L and a corresponding method.

BACKGROUND OF THE INVENTION

The first mechanical embodiments for separating two semiconductor substrates worked primarily with blades, wires or fluid jets, in particular water jets, which were inserted, pushed through or sprayed into the interface between the two substrates. This approach routinely results in at least partial destruction of the surface of at least one of the two substrates. The scratching of a substrate surface is primarily problematic for substrates that are coated and provided with functional units.

Other proposed solutions for separating two semiconductor substrates that are connected to one another in particular via an adhesive layer tracked a full-surface attachment of both substrates to their surfaces. The removal of a substrate by a (surface) force that only acts normally is technically difficult to carry out, since the adhesive strength routinely results in an at least partial destruction of the substrate.

Another separation approach was disclosed in the patent specification WO2013/091714A1. The patent specification discloses an annular, flexible tool, with which two substrates can be separated from one another by a peripheral collar of an inner side of a ring that opens on one side enclosing the peripheral edge of a first substrate. The bending moment of the annular tool allows a continuous controlled detachment of the upper substrate from a lower substrate beginning from a point on the side of the substrate stack. The production of the flexible tool is extremely expensive, however, since the peripheral collars must be fabricated with very tight tolerances. The tight tolerances are necessary in order to enclose the peripheral edges of the substrate exactly. If the peripheral collars are too large, the peripheral edge of the substrate slides from the peripheral collar; if it is too small, the peripheral edge of the substrate can really not be enclosed at all. In addition, not all substrates are made the same. Substrates can in general have different thicknesses and different, albeit standardized, peripheral edges, hi general, therefore, the peripheral collars must always pass into the respectively used type of substrate.

SUMMARY OF THE INVENTION

It is therefore the object of this invention to further develop the generic devices and method for detaching first substrates in such a way that a more efficient separation is made possible.

This object is achieved with the features of the independent claim(s). Advantageous further developments of the invention are indicated in the subclaims. Also, all combinations that are comprised of at least two of the features indicated in the specification, claims and/or drawings fall within the scope of the invention. In the ranges of values, values lying within the above-mentioned limits are also to be disclosed as boundary values and can be claimed in any combination.

The basic idea of this invention is to arrange clamping elements that act in a radial direction on the first substrate, in particular clamping elements that are matched to and/or automatically mold onto the outside contour of the first substrate, with said clamping elements on the periphery of the first substrate, in order to accommodate the substrate by clamping in the radial direction and then to detach it, namely in a detaching direction, from the second substrate by a movement crosswise to the radial direction. The detaching thus takes place preferably by the local action of the clamping elements distributed in particular on the periphery, preferably uniformly and/or in each case on opposite sides, gently from at least one side of a peripheral sector.

The invention describes a method and a unit to separate from one another two substrates, in particular temporarily bonded, by a method that is in particular mainly mechanical, preferably purely mechanical. The insertion of the unit according to the invention in a chemical bath or in connection with another unit, which sprays chemicals laterally onto the bonding surface of the two substrates, would also be conceivable. In the case of special applications, it can also be advantageous according to the invention to be able to produce an electromagnetic source, in particular an infrared lamp, still more preferably a laser, on the bonding surface, in particular through at least one of the two substrates. The outside contour of a substrate is clamped by several clamping elements that are comprised in particular at least partially of a flexible, soft material, preferably surrounded on the entire periphery. To this end, the clamping elements approach the outside contour or the periphery of the first substrate that is to be removed until its outside contour is embedded in the soft, elastic, flexible material and thus is attached by friction and/or positive fit. In this connection, a detaching force can be applied in a detaching direction L, in particular mainly, preferably exclusively, laterally on the first substrate.

The soft, elastically flexible material thus avoids stress peaks, which occur in the state of the art in the separation of substrates and can result in damage to the substrates. According to the invention, the use of sharp edges and sides, which in the case of a mechanical compressive stress on the substrate could result in damage to the substrate, can therefore be eliminated.

Another, in particular independent, aspect of this invention lies in embodying several clamping elements so that their pressurizing surface is normal to the surface of the substrate to be separated or is inclined toward the latter at least only by a very small angle. In addition, the pressurizing surface (face) of the clamping elements is comprised in particular of a soft, flexible material, in which the outside contour of the substrate to be removed can be embedded. In this case, in particular an embedding and positive-fitting partial encompassing of the outside contour of the substrate that is to be removed is carried out. The inventive and new idea is therefore primarily reflected in a gentle but still tight attachment of the outside contour of the substrate that is to be removed, which allows it to be separated from the second substrate, attached in particular in a flat manner to a substrate holding device (preferably a vacuum chuck). In this case, the second substrate can be attached directly by the substrate holding device, or, which is primarily advantageous for the attachment of thin product substrates, is attached on a film (e.g., tape), which was tightened over a frame. The attachment of the second substrate is then carried out indirectly via the attachment of the film by the substrate holder. In particular, the substrate holding device serves to attach as well as to support the substrate, in particular the thinner substrate, to prevent a rupture during the detaching process.

According to the invention, it is in particular made possible to accommodate a substrate virtually independently of its outside contour and/or diameter and/or thickness in a laterally clamping manner. In particular, manufacturing tolerances of substrates, in particular semiconductor substrates, i.e., deviations of standard sizes, play no role for the function of the invention.

The clamping elements according to the invention in particular have contour-accommodating elements, which are made in elastic form and which make possible the accommodation and attachment of each substrate edge independently of the thickness of the substrate and the substrate contour.

Another decisive advantage according to the invention consists in that tolerances in the substrate diameter are irrelevant for the clamping. If the substrate is too large or too small by a few micrometers or, fairly rarely, several millimeters, this deviation from the standard diameter is compensated for by the contour-accommodating element according to the invention by its elastic deformation and/or individual control of the clamping elements.

The substrates can have any shape but are preferably circular. The diameter of the substrates is in particular industrially standardized. For wafers, the industry-standard diameters are 1 inch, 2 inches, 3 inches, 4 inches, 5 inches, 6 inches, 8 inches, 12 inches and 18 inches. The embodiment according to the invention is preferably suitable for detaching (debonding) large substrates, therefore substrates with diameters of more than 5 inches.

The method according to the invention and the tool according to the invention are suitable in particular for separating substrates, which are bonded via a subsequent method:
Full-surface adhesion
Permanent-bonding method
Direct bond
Si—Si bond
$SiO_2$—$SiO_2$ bond
$SiO_2$—Si bond
Metal bond
Eutectic bond
Anodic bond
Temporary bonding method
Prebonding method
Bonding adhesive method
With a bonding layer
With two bonding layers
With three bonding layers
With more than three bonding layers
Side adhesion
Temporary bonding method
Bonding adhesive method
Point adhesion
Temporary bonding method
Laser tacking method The upper group of the full-surface adhesion comprises all bonding methods in which the connection of two substrates is carried out over the entire contact surface of the substrates. The bonding strength between two substrates is therefore, independently of the position, very large, preferably even the same: The full-surface adhesion is divided into a permanent bonding method and a temporary bonding method. It should not be possible to separate a permanent bond without destroying it. Permanent bonding methods are therefore only mentioned here for the sake of completeness.

Prebonding methods describe processes in which two substrates by themselves are bonded to one another by van der Waals forces. This bonding process primarily takes place between silicon substrates and/or silicon oxide substrates. The thus produced bond is referred to as a prebond, since it is a precursor of a permanent connection. In the semiconductor industry, it is very often desired to further detach a (temporary) connection produced by a prebonding, when it is determined, after the prebonding, that the two substrates are not optimally or are even improperly aligned with one another. The two substrates that are connected to one another by a prebonding in most cases can be separated again from one another without damage. In contrast to the other bonding methods mentioned in the disclosure, a prebonding method gets by completely without bonding adhesive.

The bonding adhesive methods are grouped according to the number of bonding layers that are used. Single-layer bonding adhesion methods have only a single layer. This layer is preferably a bonding adhesive, preferably a thermoplastic material, in particular for slide-off (de)bonding.

The two-layer bonding adhesive method is a method that uses the Physical and/or chemical properties of two different layers for separation. One of the two layers is in most cases a bonding adhesive, preferably a thermoplast. The other layer is in particular at least partially, preferably primarily, an anti-sticking layer (ASL) for reduction of the adhesion to the bonding adhesive or an adhesion promoter (AP) for increasing the adhesion to the bonding adhesive. According to the invention, the use of a second bonding adhesive, which is distinguished from the first bonding adhesive in its chemical and/or physical properties, would also be conceivable.

The use of three-layer bonding processes is also possible. Here, the third layer in most cases has an activating property. Analogous considerations apply for multiple-layer bonding processes.

The side adhesion method is understood as any bonding method in which the predominant adhesive force between the substrates acts in a side region. The adhesion in the center zone, i.e., any area that is surrounded by the side zone, is in particular negligibly small. The method according to the invention and the tool according to the invention are suitable preferably for separating two substrates, which only partially, preferably peripherally, have a significant adhesion to one another.

For the sake of completeness, the possibility is also still to be mentioned of separating from one another substrates that were connected to one another by a point bonding method. For example, laser tacking would be a point bonding method. In this case, the tangent surfaces of two substrates are heated in an extremely limited space by a laser, so that a spontaneous, but only locally limited, connection is formed. The detaching force to be applied for the separation of the two substrates is correspondingly low.

The tool according to the invention comprises in particular at least two, preferably more than two, more preferably more than five, even more preferably more than 10, especially preferably more than 15, clamping elements, which are arranged or can be arranged on the periphery of the substrate. The clamping elements themselves are preferably part of a clamping system (in particular in the thrill of a clamping element holding device), in particular a clamping ring or attached to the clamping ring, whereby the clamping system is arranged or can be arranged centrically to the substrate stack that is to be separated. The clamping ring is preferably circular, but can have any other shape that is matched to the outside contour of the substrate that is to be clamped. In particular, a square, more generally rectangular, shape of the clamping ring would be conceivable. The rectangular clamping ring then has a recess with the diameter that is necessary for the accommodation of the substrate stack. By the clamping ring, an easy, quick and efficient positioning of the clamping elements relative to the substrate that is to be removed can be carried out by positioning the clamping ring. In addition, the clamping ring serves as a clamping element holder and stabilizer.

An attachment of the clamping elements relative to an immovable plate, for example a(n) (upper) base plate of a detaching station according to the invention, would also be conceivable.

The clamping elements are preferably distributed uniformly along a circle, so that the latter have an angular distance α of 360°/n to one another when using n clamping elements. According to the invention, however, an at least partially non-symmetric distribution for special embodiments would also be conceivable, in particular when tools have to be brought in on the sides of the substrate stack, which did not have sufficient space in the case of a symmetric distribution of the clamping elements.

In a first embodiment according to the invention, the clamping elements in each case are comprised of a single component that in particular is made of one piece of material. The component that is also referred to as a contour-accommodating element preferably is comprised of a single, flexible material, in particular a plastic.

In a second embodiment according to the invention, the clamping element is comprised of precisely two components. The first component serves as a carrier and force transfer system from a drive onto the flexible material, which is arranged in particular on a face of the clamping element, which serves to clamp the substrate.

In a third embodiment according to the invention, the clamping element includes an L-shaped component comprised of a high-strength material and a component that is comprised of a soft, deformable material. The L-shaped component has a stop collar, which serves as a limiting element or a stop to the surface of the first substrate that is to be removed (in particular the carrier substrate), so that the level of the clamping element can be set and is limited automatically relative to the surface of the first substrate and so that a slipping of the first substrate from the clamping elements upward is prevented. In addition, it is prevented in this connection that the clamping elements according to the invention have contact with a film if the substrate stack is attached to the latter. In the semiconductor industry, these films are routinely used for attaching the product wafer that is in most cases very thin and that is connected to a carrier substrate via the bonding adhesion layer. In this case, the films are in particular stretched on a frame.

In a fourth embodiment according to the invention, the clamping element includes a component that is made of high-strength material and a movable component that can be adjusted parallel to the detaching direction L, in particular in addition to a collar piece according to the third embodiment, as well as a component that is comprised of soft and elastic material for clamping the substrate peripheral contour. The movability of the adjustable component primarily is used for the quick matching of the collar relative to the substrate that is to be detached according to the invention. By the movability of the collar, it is avoided that new collar pieces are fabricated each time for substrates with different thicknesses and/or have to be installed in the clamping system according to the invention. The adjustable components are therefore preferably only newly calibrated when a substrate with a noticeably different thickness is to be detached from the product substrate according to the invention.

In a quite special embodiment according to the invention, the movable components in each substrate to be removed according to the invention are matched especially to this substrate. In particular, an in-situ measurement of the substrate stack thickness by a comparison measurement by two interferometers and the forwarding of substrate stack thicknesses determined from this interference measurement to a computer unit would be conceivable. The computer unit can then adjust the movable components automatically to the necessary level in order to prevent a contact of the bottom of the clamping elements with a film.

All embodiments of the clamping elements according to the invention thus have at least one component that is also referred to as a contour-accommodating element that is comprised of a deformable and/or elastic and/or soft material for accommodating the substrate peripheral contour. The E-modulus of the elastic and/or soft material lies in particular between 0.01 MPa and 1,000 MPa, preferably between 0.1 MPa and 100 MPa, and more preferably between 1 MPa and 10 MPa.

Especially preferably, the face of the flexible material in the non-clamped state is normal to the surface and/or tangential to a contact point or a contact surface of the substrate peripheral contour of the substrate that is to be detached (debonded). According to the invention, it can also be inclined in the positive or negative direction to the normal, in particular oriented tangentially at the same time. The absolute value of the tilt angle of the face relative to the surface of the substrate is in this case in particular less than 40°, preferably less than 30°, even more preferably less than 20°, most preferably less than 10°, with utmost preference less than 1°, and even more preferably less than 0.1°. In particular, the face can also be inclined during the detaching process according to the invention based on the stressing acting on the clamping element respectively can be designed allowing an inclination corresponding in particular to the above-mentioned area.

The clamping elements are, in particular independently of one another, movable in the detaching direction L and opposite to the detaching direction L. In addition, the clamping elements, in particular independently of one another, can be moved in the radial direction. Because of the independent triggering of the clamping elements, a targeted introduction of a detaching wave is made possible. Thus, for example, the forces can be introduced in a time- and/or site-resolved manner at different peripheral sectors.

Sensors are preferably assigned to the clamping elements or the clamping elements have sensors that detect and/or measure the clamping, in particular the penetration of the first substrate in the soft material. In particular, the use of pressure sensors and/or distance sensors would be conceivable. Distance sensors are preferably then used when (normal) pressure forces on the substrate that are already small can lead to its damage, and a too strong contact is to be prevented. In quite special embodiments, distance and pressure sensors are combined with one another. In this case, the distance sensors are used in particular for the quickest possible approach. During this approach phase, there is still no contact of the clamping elements with the substrate. The pressure sensors are then used in the contacting phase in order to determine the position of the clamping elements, in which the first time, pressurization is carried out by contact of the clamping elements with the substrate on the substrate peripheral contour. The use of distance sensors alone, which is applied primarily when the substrates that are used have reproducible mean diameters, would also be conceivable.

The pressure and/or distance sensors are anchored in particular in the drive means and/or the clamping elements. The measuring signals of the pressure and/or distance sensors are read out by software and/or firmware and/or hardware and are used for the control and/or the triggering of the drive means respectively the clamping elements. Thus, for example, algorithms in software and/or firmware can ensure that the clamping elements are operated until the pressure sensors or distance sensors exceed or fall short of a preset pressure or a preset distance. After reaching this threshold value, the drive means automatically hold the clamping elements. A corresponding implementation of such algorithms in software with corresponding recipe configuration and graphical user interface would also be conceivable, so that a user of the embodiment according to the invention has knowledge of the state of the drive means and/or the clamping elements at all times, or can program the drive means and/or the clamping elements accordingly.

In one embodiment of the invention, the clamping elements are equipped with heaters or heating elements are assigned to the clamping elements, which heating elements can at least locally heat the connecting layer, which connects the first substrate (carrier substrate) to the second substrate (product substrate). Because of the excellent heat conductivity of some substrate materials, in particular silicon, the heating elements are preferably suitable, however, to heat the entire periphery of the carrier substrate. Primarily the heating above a glass transition temperature of used material, in particular adhesive, is advantageous to the connecting layer. Based on the material that is used, the latter is in particular above 0° C., preferably above 100° C., more preferably above 200° C., even more preferably above 300° C., with utmost preference above 400° C., and most preferably above 500° C. The introduction of heat is preferably done via a stop collar of the clamping device according to the invention.

According to an advantageous embodiment according to the invention, the device preferably has sensors in order to record forces that act vertically and/or horizontally. These can be forces that act on the clamping device and/or the clamping ring and/or the clamping elements or between the above-mentioned components. Using the measurement of force, it can be determined in particular according to the invention how large the forces are that act radially on the substrate side. The accommodation and evaluation of these forces is important in order to avoid excessive transfer of force to the substrate and thus damage to or a rupture of the substrate.

Especially preferably, therefore, the embodiment according to the invention is controlled via software with whose assistance upper boundary values can be indicated, under which the individual components can be most strictly controlled in order to prevent a rupture of the substrate.

The contour-accommodating element is comprised in particular of an expandable and/or soft and/or elastic material, preferably a polymer, such as, for example, a plastic or a silane. According to the invention, the use of a foamed material would also be conceivable. The material that is used can be comprised alternately of an extremely soft and highly-plastic metal. Preferably, this metal does not contaminate the surface of the substrate, however. According to the invention, especially conceivable materials or material classes for the material of the contour-accommodating element are:

Polymers, in particular
  Plastics, in particular
    Elastomers, in particular
      Viton (material) and/or
      Polyurethanes and/or
      Hypalon (material) and/or
      Isoprene rubber (material) and/or
      Nitrile rubber (material) and/or
      Perfluoro rubber (material) and/or
      Polyisobutene (material),
    Thermoplastic elastomers and/or
    Foams, in particular
      Arcel (material) and/or
      Neopor (material) and/or
      Polyisocyanurates and/or
      Polystyrenes and/or
      Cellular rubber,
  Silanes, in particular
    Silicone,
Composite materials, in particular
That are comprised of carbon fibers
Metals, in particular
Extremely soft metals, such as Pb (lead) or Sn (tin) and/or
Al, Pt, Au, Ag, Zn, Ni, Fe, Co, Mo, Nb,
Alloys, in particular
Brass, bronze and/or
Steel, in particular stainless steel such as chromium-nickel steel or chromium-nickel-molybdenum steel, and/or
Nickel-based alloys, and/or
Aluminum-based alloys.

For the device according to the invention and the method according to the invention as well as the use according to the invention, the described features apply analogously.

In quite special embodiments, the contour-accommodating element is constructed so that it has a constant, concave curvature. The concave curvature then serves as accommodation for the outside contour of the corresponding substrate. The material that is used in each case for the contour-accommodating element is in particular correspondingly soft and elastic. The latter is not the case when the concave curvature conforms to the corresponding functional properties and is able to implement the detaching process with one of the embodiments according to the invention.

Additional advantages, features and details of the invention follow from the description of preferred embodiments as well as based on the drawings.

BRIEF DESCRIPTION OF THE DRAWINGS

in the figures, components that are the same or that have the same effect are identified with the same reference numbers.

DETAILED DESCRIPTION OF THE INVENTION

Figure 5A:
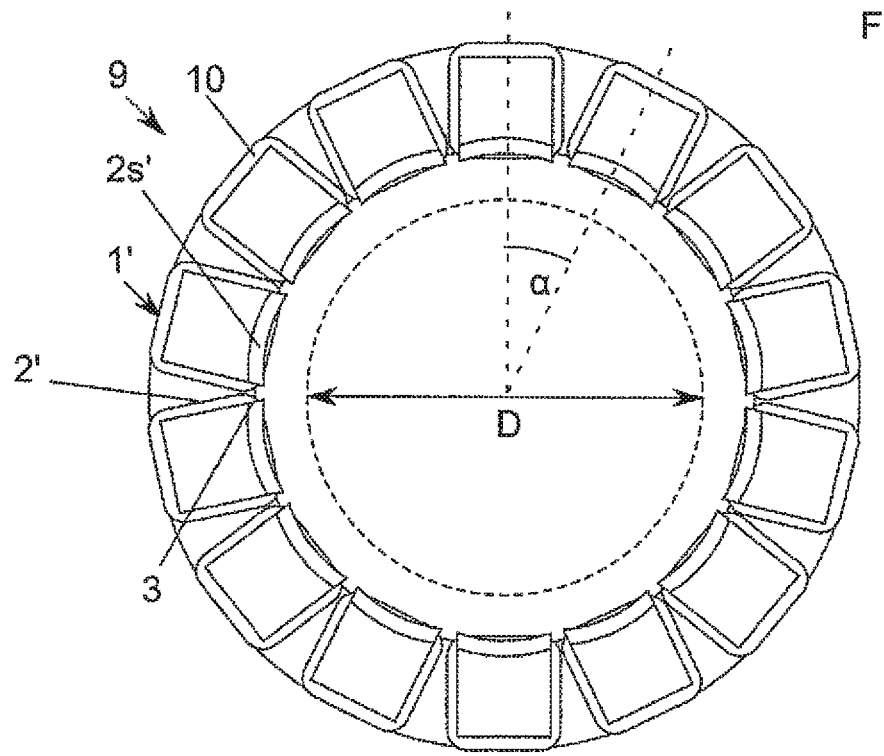
Figure 5B:
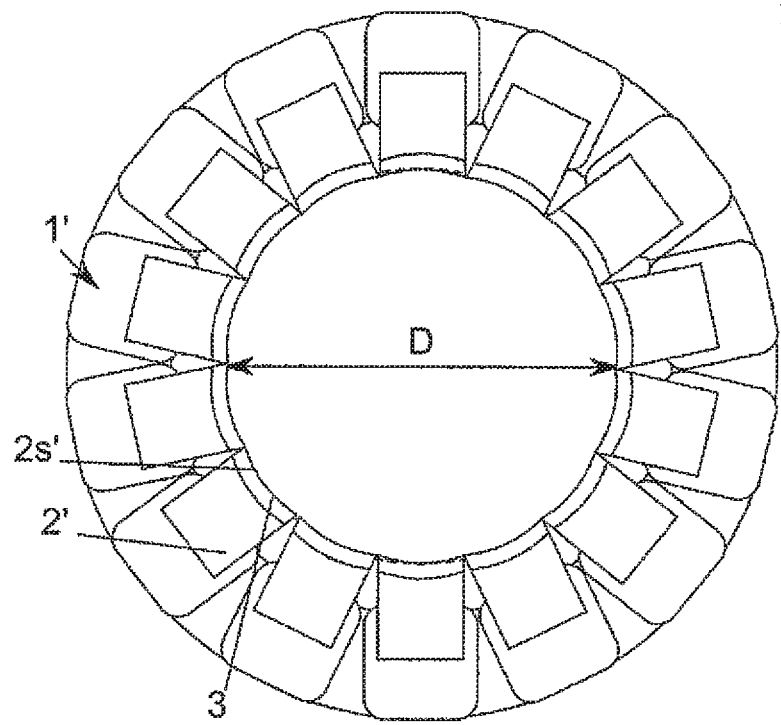

The two FIGS. 5a and 5b show the diagrammatic bottom view of a clamping element holding device 9, designed in particular as a clamping ring according to the invention with several clamping systems according to the invention, in particular clamping elements 1, 1', 1", 1'". The clamping elements 1, 1', 1", 1'" are guided, in particular in a sliding manner, relative to the clamping element holding device 9 and are tightly connected to the clamping ring via drive means 10, in particular motors. The motors are able to run the clamping elements 1, 1', 1", 1'" according to the invention in a radial direction R and thus to achieve a clamping of a first substrate 8 that is designed as a carrier substrate. The radial direction R relates to the first substrate 8. The drive means 10 serve to change the position of the clamping elements 1, 1', 1", 1'" and to adjust a clamping force F. The drive means 10 are therefore preferably configured in such a way that the clamping force F is adjustable.

During clamping, the clamping elements are oriented laterally in an attaching plane defined by the first substrate 8, in particular an attaching surface 8o of the first substrate 8. The area in which the clamping elements 1, 1', 1", 1'" act on the first substrate 8 is referred to as clamping area B. The clamping area B lies in particular in a peripheral area, as in the area of the edge of the first substrate 8.

In a preferred embodiment for the triggering of the clamping elements 1, 1', 1'", no motors but rather hydraulic and/or pneumatic control elements are used. As a result, an especially economical and efficient type of design is made possible, since motors can be eliminated. The triggering of the hydraulic and/or pneumatic elements is done with fluids, for example gases and/or liquids, which have a pressure that is higher than $10^{-5}$ mbar, preferably higher than $10^{-3}$ mbar, more preferably higher than 0.1 bar, most preferably higher than 1 bar, and with utmost preference higher than 2 bar.

FIG. 5a shows the state in which all drive means 10 have run the clamping elements 1, 1', 1", 1'" into their starting position relative to the first substrate 8. In order to be able to attach the first substrate 8 of substrate stack 12 that is positioned centrically to the clamping element holding device 9, the clamping elements 1, 1', 1", 1'" are run radially (radial direction R) by the drive means 10 to the center of the clamping element holding device 9.

A clamping position, in which it would result in a clamping according to the invention, is depicted in FIG. 5b (without substrate 8). The embodiment according to the invention in accordance with FIGS. 5a and 5b shows the clamping element holding device 9, which can approach the substrate stack 12, in particular from above. In particular, in this case, the clamping element holding device 9 is oriented relative to the substrate stack 12. Drive means for moving the clamping element holding device 9 or the clamping elements 1, 1'1", 1'" in and opposite to the detaching direction are not shown and can be formed in particular by actuators or a robotic arm, which at the same time serve as detaching means in terms of this invention.

The drive means 10 are preferably located in a preferred manner between the clamping ring 9 and the clamping elements 1, 1', 1", 1'" according to the invention.

In a quite especially preferred embodiment, many clamping elements 1, 1', 1", 1'" according to the invention are attached to the clamping element holding device 9 so that in the clamping position of the clamping elements 1, 1', 1", 1'", faces 3s of the contour-accommodating element 3 that point in the direction of a substrate peripheral contour 8k of the substrate 8 form a shell surface that is in particular radially symmetric and/or closed. The shell surface is preferably an inside surface of a cylinder that is comprised of the individual contour-accommodating elements 3.

Figure 6A:
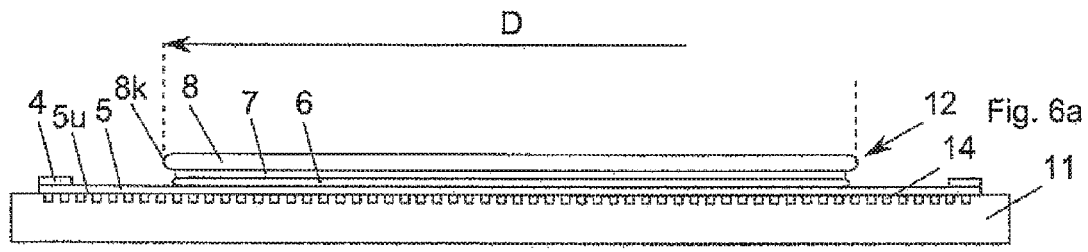
FIG. 6i a diagrammatic side view of the embodiment according to FIG. 6a in a ninth process step, FIG. 6j a diagrammatic side view of the embodiment according to FIG. 6a in a tenth process step, and FIG. 6k a diagrammatic side view of another embodiment according to the invention.
Figure 6B:
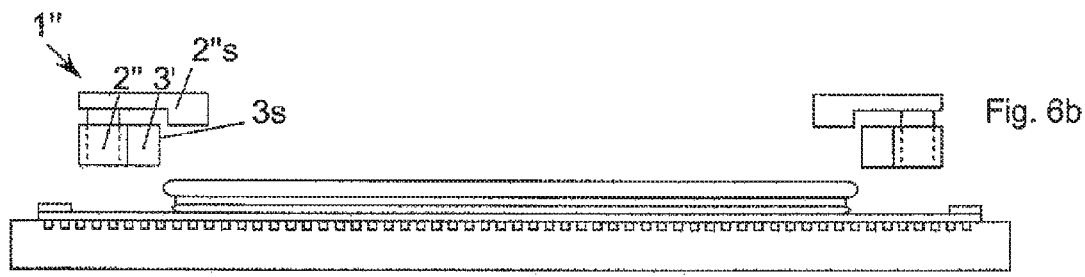
Figure 6C:
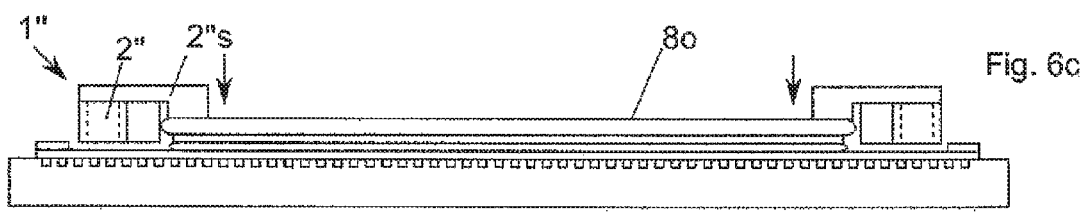
Figure 6D:
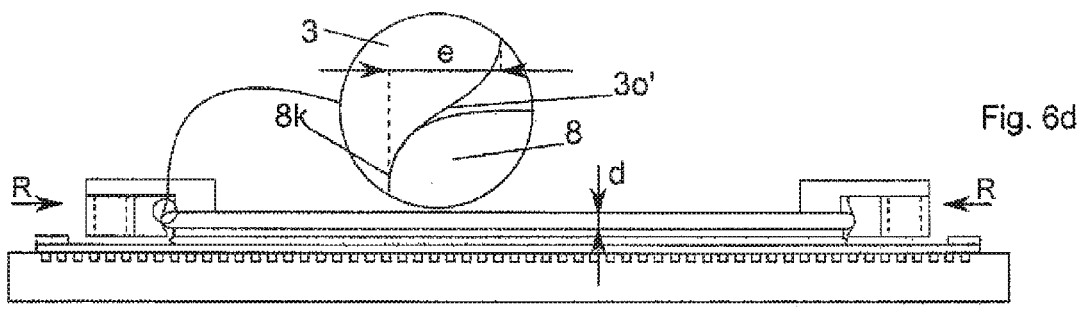

In the clamping of the first substrate 8, the faces 3s of the contour-accommodating elements 3 are deformed elastically inward, i.e., in the radial direction R (see FIG. 6d). As a result, it is made possible according to the invention to elastically embed the entire substrate peripheral contour 8k, in particular in its entirety, in the contour-accommodating elements 3, and thus to prevent stress peaks on the first substrate 8 before and/or during the detaching process according to the invention. These stress peaks would arise primarily on the substrate peripheral contours 8k of the first substrate 8 that are not covered in their entirety by the contour-accommodating elements 3 according to the invention and in the worst case result in the rupture of the first substrate 8.

FIGS. 6a-6g show a detaching process according to the invention with the embodiment according to the invention. The detaching process is depicted by way of example with the embodiment of the clamping element 1".

FIG. 6a shows a substrate stack 12, comprised of a second substrate 6, a connecting layer 7 that is embodied as an adhesive, and a first substrate 8. The substrate stack 12 is attached to a film 5 that is tightened by a frame 4.

The first substrate 8 has a diameter D. The diameter of the second substrate 6 is in particular approximately equal to the diameter D of the first substrate 8.

In a first step according to the invention in accordance with FIG. 6a, an underside 5u of the film 5 is attached to a substrate holding device 11 (in particular a lower specimen holder designed as a chuck). The attachment is preferably carried out via vacuum strips 14. As an alternative, mechanical, electrostatic, magnetic or adhesive attachments are conceivable. During the detaching of the first substrate 8, the attachment by the substrate holding device 11 applies a corresponding counterforce $G_1$ to the detaching force F. The counterforce $G_1$ is preferably to be greater overall than the detaching force F at least at the beginning of the detaching.

In a second step according to the invention in accordance with FIG. 6b, the clamping elements 1" are positioned distributed on the periphery of the substrate stack 12. The clamping elements 1" are preferably attached to a clamping ring, but as an alternative can be attached to the substrate holding device 11.

Corresponding to the embodiment that is used, the clamping elements 1" are able, according to the invention, to execute at least a radial movement as well as a translational movement in and opposite to the detaching direction L. To this end, corresponding drive means are provided.

In order to depict the detaching process according to the invention in as general a manner as possible, a depiction of the clamping element holding device 9 or other attaching means and drive means for the clamping elements 1" was eliminated in FIGS. 6a-6i.

In the second step, one or more stop collars 2s", preferably one stop collar 2s" per clamping element 1", can be moved up to the attaching surface 8o of the first substrate 8 that faces away from the second substrate 6. Thus, the clamping elements 1" are oriented in the detaching direction L due to their design without an exact positional control being necessary.

The stop collar 2s" is preferably connected via a support 2" to the clamping element 1", in particular molded onto the clamping element 1" in an integral manner. In special embodiments, the stop collar 2s" can be eliminated.

Figure 1A:
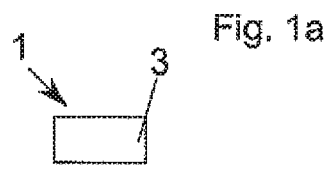
FIG. 1a a diagrammatic side view of a first embodiment of a clamping element according to the invention, FIG. 1b a diagrammatic view of the embodiment according to FIG. 1a from below, FIG. 2a a diagrammatic side view of a second embodiment of a clamping element according to the invention, FIG. 2b a diagrammatic view of the embodiment according to FIG. 2a from below, FIG. 3a a diagrammatic side view of a third embodiment of a clamping element according to the invention, FIG. 3b a diagrammatic view of the embodiment according to FIG. 3a from below, FIG. 4a a diagrammatic side view of a fourth embodiment of a clamping element according to the invention, FIG. 4h a diagrammatic view of the embodiment according to FIG. 4a from below, FIG. 5a a diagrammatic view of an embodiment of a clamping element holding device according to the invention from below in a starting position, FIG. 5b a diagrammatic view of the embodiment according to FIG. 5a from below in a clamping position, FIG. 6a a diagrammatic side view of an embodiment of the method according to the invention in a first process step, FIG. 6b a diagrammatic side view of the embodiment according to FIG. 6a in a second process step, FIG. 6c a diagrammatic side view of the embodiment according to FIG. 6a in a third process step, FIG. 6d a diagrammatic side view of the embodiment according FIG. 6a in a fourth process step, FIG. 6e a diagrammatic side view of the embodiment according to FIG. 6a in a fifth process step, FIG. 6f a diagrammatic side view of the embodiment according to FIG. 6a in a sixth process step, FIG. 6g a diagrammatic side view of the embodiment according to FIG. 6a in a seventh process step, FIG. 6h a diagrammatic side view of the embodiment according to FIG. 6a in an eighth process step.
Figure 1B:
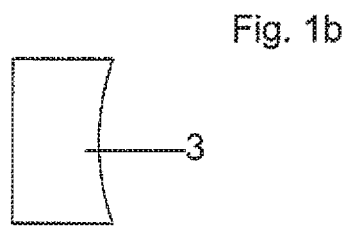
Figure 2A:
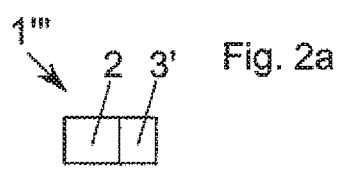
Figure 2B:
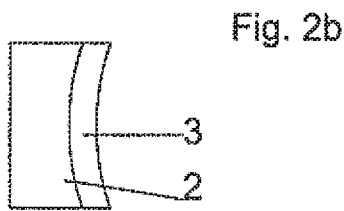
Figure 3A:
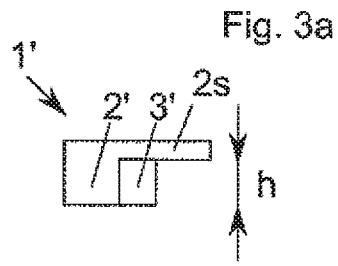
Figure 3B:
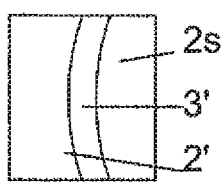
Figure 4A:
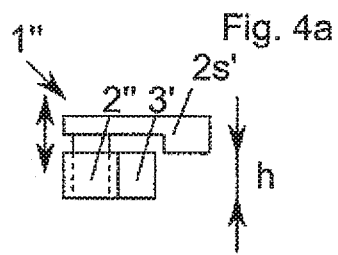
Figure 4B:
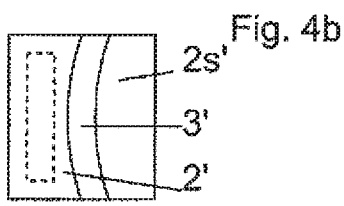

The stop collar 2s" is preferably adjustable mechanically, pneumatically, hydraulically, electrically, in particular in the detaching direction L, relative to the support 2". In one embodiment, the adjustability of the stop collar 2s" in the detaching direction L is eliminated, and a stop collar 2s" that is tightly connected to the support 2' is used (see FIG. 1c).

In a third step according to the invention in accordance with FIG. 6c, the clamping elements 1 are lowered to the stop of the stop collar 2" on the attaching surface 8o or positionally-controlled, in particular based on sensor data. The position of the clamping elements 1" can be limited by the contact of the stop collar 2s" and the top 8o of the first substrate 8. The stop collar 2s" is preferably configured in such a way that it can be positioned in any z-position in the detaching direction L and thus offers the possibility of preventing the contact of the clamping element 1" with the film 5.

Should a clamping device 1', which has no movable stop collar 2s", be used, the stop collar 2s', the support 2 and the contour-accommodating element 3 are preferably constructed in such a way that the film 5 is preferably not touched during the entire process sequence according to the invention.

In a fourth step according to the invention in accordance with FIG. 6d, the clamping elements 1" are run radially toward the center of the first substrate 8 until the substrate peripheral contour 8k has been received from the soft material of the contour-accommodating element 3 up to a penetration depth e. The penetration depth e of the substrate peripheral contour 8k is in particular larger than 1 µm and smaller than 3 mm, preferably larger than 10 µm and smaller than 1 mm, more preferably larger than 200 µm and smaller than 500 µm, and with utmost preference larger than 300 µm. According to the invention, in particular the ratio between the penetration depth e of the substrate peripheral contour 8k and the thickness d of the first substrate 8 is important. The larger the thickness d of the first substrate 8, the greater the penetration depth e of the substrate peripheral contour 8k is selected. It preferably holds true that the ratio between the penetration depth e of the substrate peripheral contour 8k and the thickness d of the first substrate 8 is smaller than 5, preferably smaller than 1, still more preferably smaller than $1/10$, most preferably smaller than $1/100$, and all the more preferably smaller than $1/1,000$. As an example, a 300 mm carrier wafer is named as a first substrate with an average thickness of 1,000 µm (industry-standard average of 775 µm). In a ratio of 3 that is preferred according to the invention, this would mean that the penetration depth e of the substrate peripheral contour 8k is 3,000/1,000, and therefore 3 mm. In absolute values, the penetration depth is preferably smaller than 3 mm, more preferably smaller than 1 mm, still more preferably smaller than 0.1 mm, most preferably smaller than 0.01 mm, and all the more preferably smaller than 0.001 mm.

In this case, the face 3s is in particular pressed inward approximately in the middle and deformed in a concave manner at least in sections. This step shows the most important idea according to the invention, namely the gentle accommodation of the substrate peripheral contour 8k by a deformable, soft contour-accommodating element 3. Preferably, the accommodation of the substrate peripheral contour 8k is detected by an electrical measuring apparatus of the device. In particular, force sensors are suitable, which are arranged at a position suitable for the measurement, preferably on the clamping element 1".

After the attachment of the substrate peripheral contour 8k by the contour-accommodating element 3, there are several possibilities for embodying the detaching of the first substrate 8 from the second substrate 6.

The first possibility according to the invention calls for the use of an attaching element 17''', in particular in the form of an upper specimen holder, preferably a vacuum specimen holder with vacuum strips 14 for suctioning the first substrate 8.

The attaching element 17''' is designed in particular to yield in a flexible manner and/or allows a deformation of the first substrate 8 in an inside area that is arranged inside the clamping area.

The attaching element 17''' preferably has a sealing element 15, in particular in the form of a circumferential sealing ring that limits the inside area. Inside the sealing element 15, a vacuum 16 is produced between the attaching element 17''' and the first substrate 8. At least during the detaching of the first substrate 8 from the second substrate 6, the vacuum is preferably adjusted to an absolute pressure of less than 1 bar, preferably less than 1 mbar, more preferably less than $10^{-3}$ mbar, most preferably less than $10^{-5}$ mbar, and with utmost preference less than $10^{-8}$ mbar.

The attaching element 17''' is movable in particular independently of the clamping elements in and opposite to the detaching direction L. Because of a corresponding control, the attaching element 17''' is able to exert a counterforce $G_2$, in addition to the counterforce $G_1$ of the substrate holding device 11 to a detaching force F that is exerted by the clamping elements 1", by which the first substrate 8 in the inside area at least at the beginning of the detaching, in particular during the detaching of the clamping area B, is attached to the second substrate 6, in particular in addition.

Figure 6E:
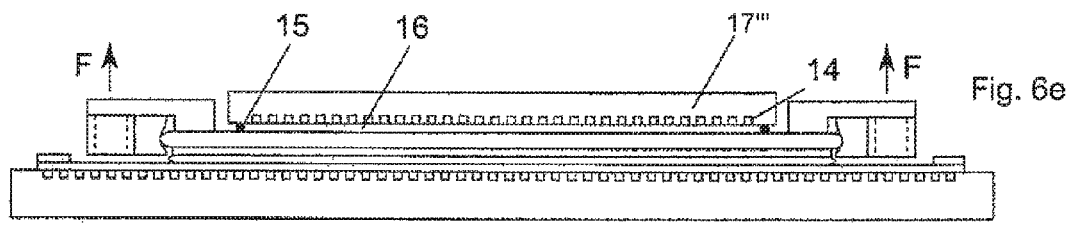
Figure 6F:
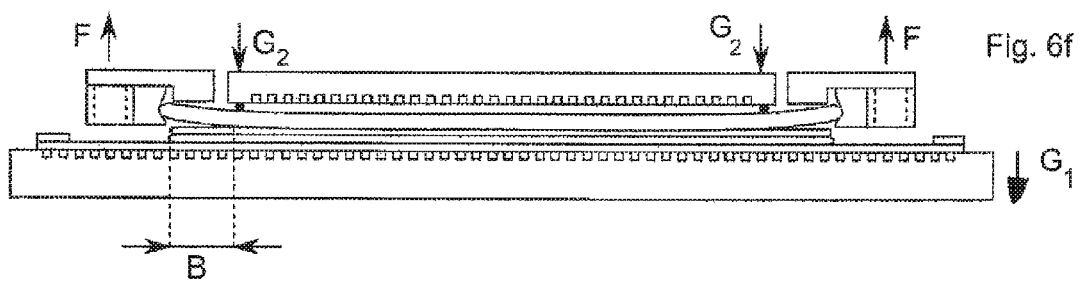

In a sixth step according to the invention in accordance with FIG. 6f, the clamping elements 1" are pulled in particular upward with the detaching force F accordingly in the detaching direction L. Because of the attachment of the substrate peripheral contour 8k onto the contour-accommodating element 3 and because of the counterforces $G_1$, $G_2$ that act on the specimen holder (substrate holding device 11)

and the attaching element 17''', a bending stress results in the clamping area B. The bending stress results in a detachment of the first substrate 8 from the second substrate 6.

By application of the vacuum 16, the progressive detachment of the first substrate 8 from the connecting layer 7 or from the second substrate 6 is supported by the force exerted by the existing overpressure between the first substrate 8 and the adhesive 7 relative to the vacuum 16.

Figure 6G:
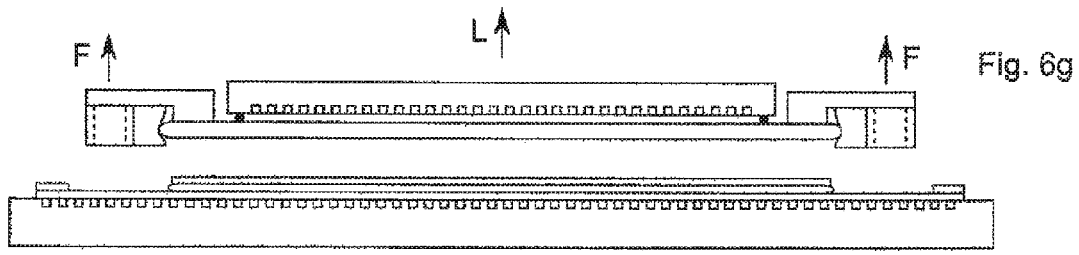
Figure 6H:
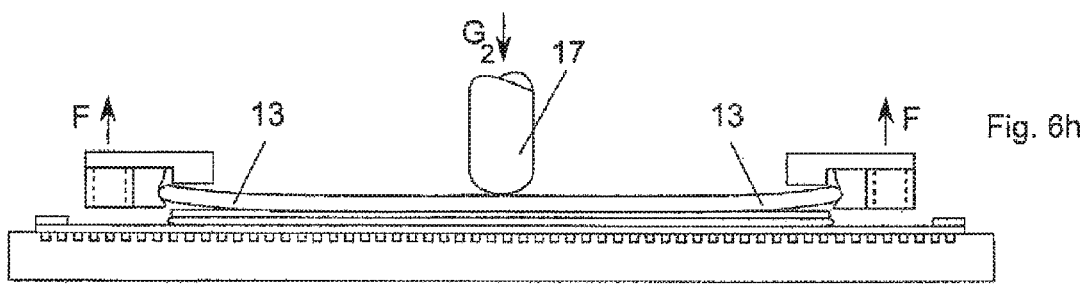

In a seventh step according to the invention in accordance with FIG. 6g, the first substrate 8 was completely detached from the second substrate 6. In this case, the first substrate 8 is preferably attached by the attaching element 17'''—in addition to the lateral attachment by the clamping element 1''. As a result, it is possible, in an additional step, not shown, to loosen the attachment of the clamping elements 1'' by their radial movement into the starting position immediately in connection to the detaching of the first substrate 8. The first substrate 8 is then only still attached to the attaching element 17''' and can be removed from the device without damage. The attaching element 17''' is therefore preferably designed as a chuck.

The second possibility calls for the use of an attaching element 17, whose object exists exclusively in applying the counterforce $G_2$ to attach parts of the substrate stack 12, in particular the inside area of the first substrate 8, during the detaching process.

The attaching element 17, 17', 17'' can have various shapes. It can be in particular:

- A rounded pin (attaching element 17 according to FIG. 6h).
- A cylinder (attaching element 17' according to FIG. 6i) with a correspondingly large radius in order to cover a major part of the attaching surface 8o, or
- A deformable membrane (attaching element 17'' according to FIG. 6j), which can be inflated like a balloon and thus a pressure valve that can be controlled in particular on a contact surface to the attaching surface 8o.

One drawback of the last-mentioned embodiments includes the fact that there is no way to attach the first substrate 8 to the attaching element 17, 17', 17'', which is provided by the attaching element 17''' according to FIGS. 6e-6g.

Figure 6I:
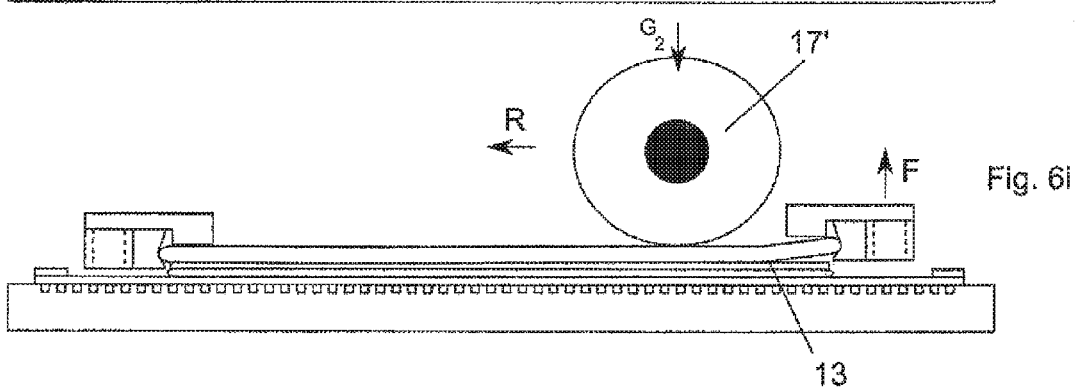
Figure 6J:
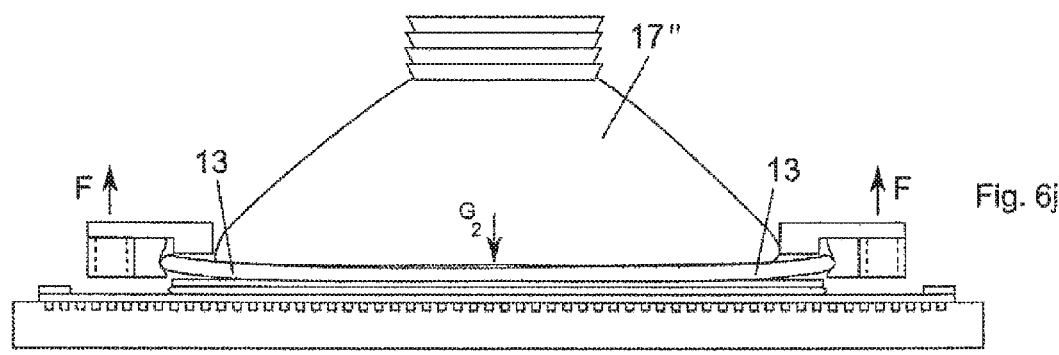

In particular, the use of a roller as an attaching element 17' according to FIG. 6i, which preferably moves linearly in the direction of movement Q over the first substrate 8 and exerts the counterforce $G_2$ on the first substrate 8, would be conceivable. Initially only the clamping element 1'' (on the right in FIG. 6i) that is arranged in the direction opposite to the direction of movement Q of the roller is preferably raised. According to the invention, sequential individual activation of the clamping elements 1'' following in the direction of movement Q of the roller is conceivable. The roller would then act on the first substrate 8 locally along a line, running parallel to the roller axis, to the attaching surface 8o with the counterforce $G_2$. Thus, it was possible to control the advance of a detaching wave 13 initiated by the clamping elements 1, 1', 1'' according to the invention.

A targeted initiation of the detaching wave 13 from any point on the periphery of the first substrate 8 is made possible by the individual triggering according to the invention of the clamping elements 1, 1', 1'' and/or a tilting of the clamping element holding device 9 relative to the first substrate 8 and/or the use of the attaching elements 17, 17', 17'', 17'''. The detaching wave 13 is preferably started from a single point. The advancing of the detaching wave 13 is carried out after the initiation with considerably less expenditure of energy.

Primarily when using substrates provided in the inside area with an anti-adhesive layer, it may be advantageous to implement such a bonding wave initiation along the entire periphery of the substrate and only then to further detach the first substrate 8.

In another embodiment according to the invention, the attaching element 17'' is designed as a bellows, which can be inflated using compressed air and thus can optionally match the shape of the first substrate 8. In this variant, primarily a gentle and uniform distribution of force of the counterforce $G_2$ produced by the attaching element 17'' occurs.

Figure 6K:
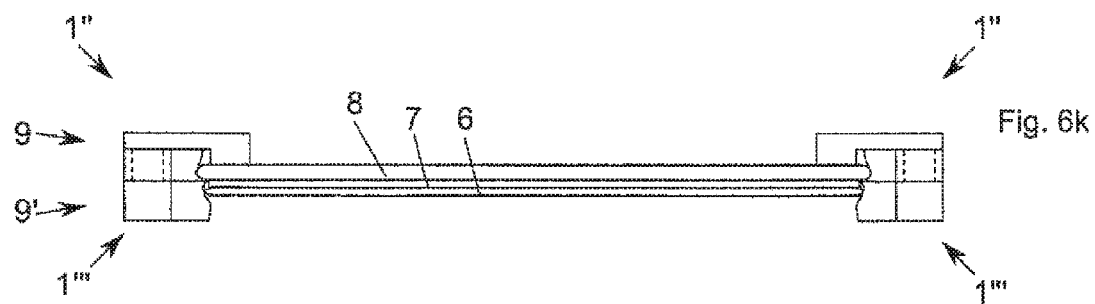

In another embodiment according to the invention in accordance with FIG. 6k, a second clamping element holding device 9' according to the invention is used as a substrate holding device 11' with additional clamping elements 1''' in order to attach the second substrate 6 analogously to the first substrate 8 in the radial direction to a substrate peripheral contour of the second substrate. The additional clamping elements 1''' at least partially replace the function of the substrate holding device 11. The clamping element holding device in particular has the shape of a clamping ring.

It is conceivable, for example, that the substrate stack 12 is first mounted on several pins or a platform (not indicated), whose diameter is smaller than the diameter of the second substrate 6. Then, the second substrate 6 is attached by the clamping elements 1'' of the second clamping element holding device 9'.

It is conceivable in particular that the second substrate 6 in addition rests on the substrate holding device 11 and is attached by the clamping elements 1''' of the clamping element holding device 9' (instead of by vacuum strips 14). The clamping elements 1''' of the clamping element holding device 9' are manufactured in particular with a very small thickness.

Primarily the disposition of such a substrate stack 12 on several pins provides for the smallest possible contamination of the second substrate 6. This embodiment according to the invention is therefore primarily suitable for the substrate stack 12, whose lower substrate 6 or upper substrate 8 is still thick so that after the detaching process, a corresponding rigidity is provided, so that a fill-surface attachment or support is unnecessary.

According to another preferred embodiment of the invention, not, shown, the detaching process of the first substrate 8 from the second substrate 6 is carried out without aids, such as the attaching elements 17, 17', 17'' or the substrate holding device 11, 11'. In this case, the first substrate 8 is held by the clamping elements 1, 1', 1'', 1''' according to the invention after the detaching process.

LIST OF REFERENCE SYMBOLS

1, 1', 1'', 1''' Clamping element
2, 2', 2'' Support
2s, 2s' Stop collar
3, 3' Contour-accommodating element
3s Face
4 Frame
5 Film
5u Underside
6 Second substrate
7 Connecting layer
8 First substrate
8k Substrate peripheral contour
8o Attaching surface
9, 9' Clamping element holding device
10 Drive means 11, 11' Substrate holding device
12 Substrate stack
13 Bonding wave
14 Vacuum strips
15 Seal
17, 17', 17", 17''' Attaching element
L Detaching direction
R Radial direction
F Clamping force
$G_1$, $G_2$ Counterforce
B Clamping area
e Penetration depth
α Angular distance
Q Direction of movement
D Diameter of the first substrate
d Thickness of the first substrate Having described the invention, the following is claimed:

1. A device for detaching a carrier wafer from a product wafer in a detaching direction (L), said device comprising:
   at least two clamping elements configured to move crosswise to the detaching direction (L) and in a radial direction (R) relative to the carrier wafer to clamp the carrier wafer crosswise to the detaching direction (L), wherein each of the clamping elements includes elastic contour-accommodating elements for accommodating and fixing an edge of the carrier wafer;
   a substrate holding device for holding the product wafer, and
   detaching means for detaching the carrier wafer from the product wafer by moving the substrate holding device in a direction opposite to the detaching direction (L).

2. The device according to claim 1, further comprising drive means for moving the at least two clamping elements in the radial direction (R) and/or in the detaching direction (L).

3. The device according to claim 1, wherein said two clamping elements are arranged radially opposite to each other.

4. The device according to claim 1, wherein the clamping elements have an elastic face facing in the radial direction (R) toward the carrier wafer, said elastic face elastically yielding clamping of the carrier wafer.

5. The device according to claim 1, wherein the substrate holding device is a rigid substrate holding device that receives an entire surface of the product wafer.

6. The device according to claim 1, further comprising a clamping element holding device movable in the detaching direction (L), for holding and guiding the clamping elements.

7. The device according to claim 1, further comprising an attaching element for partial attachment of the carrier wafer to the product wafer when detaching the carrier wafer.

8. The device according to claim 7, wherein the partial attachment in an inside area is carried out on an attaching side of the carrier wafer facing away from the product wafer.

9. The device according to claim 7, wherein the attaching element includes attaching means for attaching the carrier wafer to the attaching element.

10. The device according to claim 1, further comprising drive means for moving the at least two clamping elements in the radial direction (R) and the detaching direction (L).

11. The device according to claim 1, further comprising drive means for moving the at least two clamping elements in the radial direction (R).

12. A method for detaching a carrier wafer from a product wafer in a detaching direction (L), said method comprising:
   holding the product wafer with a substrate holding device;
   clamping the carrier wafer crosswise to the detaching direction (L), the clamping comprising:
      guiding at least two clamping elements crosswise to the detaching direction (L) and in a radial direction (R) relative to the carrier wafer, and
      accommodating and fixing an edge of the carrier wafer using elastic contour-accommodating elements of the clamping elements; and
   detaching the carrier wafer from the product wafer, the detaching comprising moving the clamping elements in the detaching direction (L) and/or the substrate holding device opposite to the detaching direction (L).

13. The method according to claim 12, further comprising moving the clamping elements in the radial direction (R) and in the detaching direction (L).

14. The method according to claim 12, further comprising partially attaching the carrier wafer to the product wafer by attaching means of an attaching element during detaching the carrier wafer with a counterforce ($G_2$) directed opposite to the detaching direction (L).

15. The method according to claim 14, wherein the partial attachment in an inside area is carried out on an attaching side of the carrier wafer facing away from the product wafer.

16. The method according to claim 12, further comprising moving the clamping elements in the radial direction (R) and the detaching direction (L).

17. The method according to claim 12, further comprising moving the clamping elements in the radial direction (R).

18. A device for detaching a carrier wafer from a product wafer in a detaching direction (L), said device comprising:
   a plurality of radially arranged clamping elements, the clamping elements being respectively configured to move crosswise to the detaching direction (L) in a radial direction (R) to clamp corresponding peripheral edges of the carrier wafer, each of the clamping elements including elastic contour-accommodating elements configured to accommodate and fix the corresponding peripheral edge of the carrier wafer;
   a substrate holding device for holding the product wafer; and
   detaching means for detaching the carrier wafer from the product wafer by moving the substrate holding device in a direction opposite to the detaching direction (L).

19. The device according to claim 18, further comprising a controller configured to control movement of said clamping elements to clamp said corresponding peripheral edges of the carrier wafer.

20. The device according to claim 19, wherein said controller is further configured to control said movement of said clamping elements individually.

* * * * *